United States Patent
Mizunashi et al.

(10) Patent No.: US 10,040,924 B2
(45) Date of Patent: Aug. 7, 2018

(54) ADHESION PROMOTER, ADDITION CURABLE ORGANOPOLYSILOXANE RESIN COMPOSITION AND SEMICONDUCTOR APPARATUS

(71) Applicant: SHIN-ETSU CHEMICAL CO., LTD., Tokyo (JP)

(72) Inventors: Tomoyuki Mizunashi, Annaka (JP); Hiroyuki Iguchi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 5 days.

(21) Appl. No.: 15/295,514

(22) Filed: Oct. 17, 2016

(65) Prior Publication Data

US 2017/0121504 A1 May 4, 2017

(30) Foreign Application Priority Data

Nov. 2, 2015 (JP) .................. 2015-215958

(51) Int. Cl.

| | | |
|---|---|---|
| C08K 5/5475 | (2006.01) | |
| C08G 77/08 | (2006.01) | |
| H01L 33/26 | (2010.01) | |
| H01L 33/56 | (2010.01) | |
| H01L 33/58 | (2010.01) | |
| C09J 183/04 | (2006.01) | |
| C08G 77/00 | (2006.01) | |
| C08G 77/12 | (2006.01) | |
| C08G 77/20 | (2006.01) | |

(52) U.S. Cl.
CPC ............ C08K 5/5475 (2013.01); C08G 77/08 (2013.01); C09J 183/04 (2013.01); H01L 33/26 (2013.01); H01L 33/56 (2013.01); H01L 33/58 (2013.01); C08G 77/12 (2013.01); C08G 77/20 (2013.01); C08G 77/80 (2013.01); C08G 2190/00 (2013.01)

(58) Field of Classification Search
CPC ....... C08K 5/5475; C08G 77/12; C08G 77/20
See application file for complete search history.

(56) References Cited

U.S. PATENT DOCUMENTS

| | | |
|---|---|---|
| 4,483,973 A | 11/1984 | Lucas et al. |
| 6,124,407 A | 9/2000 | Lee et al. |
| 2005/0214644 A1* | 9/2005 | Aramata ............... H01B 1/122 |
| | | 429/218.1 |
| 2009/0118441 A1 | 5/2009 | Yamamoto et al. |
| 2009/0294796 A1 | 12/2009 | Morita et al. |
| 2011/0224344 A1 | 9/2011 | Fujisawa et al. |
| 2014/0175505 A1 | 6/2014 | Yamazaki et al. |

FOREIGN PATENT DOCUMENTS

| | | |
|---|---|---|
| EP | 2 374 832 A1 | 10/2011 |
| JP | 2006-213789 A | 8/2006 |
| JP | 2007-131694 A | 5/2007 |
| JP | 2011-252175 A | 12/2011 |
| JP | 5060074 B2 | 10/2012 |
| JP | 2012-214554 A | 11/2012 |
| JP | 2013-204029 A | 10/2013 |
| JP | 2014-218679 A | 11/2014 |
| WO | 2013/035736 A1 | 3/2013 |
| WO | 2016/138090 A1 | 9/2016 |

OTHER PUBLICATIONS

Feb. 27, 2017 Extended Search Report issued in European Patent Application No. 16002325.5.

* cited by examiner

*Primary Examiner* — Kuo Liang Peng
(74) *Attorney, Agent, or Firm* — Oliff PLC

(57) ABSTRACT

The present invention provides an adhesion promoter for promoting adhesiveness of a cured product of an addition curable organopolysiloxane resin composition, the adhesion promoter comprising at least one alkoxy group bonded to a silicon atom, and at least one cyano group-containing organic group bonded to a silicon atom in one molecule. There can be provided an adhesion promoter which can make a cured product of an addition curable organopolysiloxane resin composition excellent in heat resistance, workability, adhesiveness, and gas barrier property by adding it to the composition.

11 Claims, No Drawings

ADHESION PROMOTER, ADDITION CURABLE ORGANOPOLYSILOXANE RESIN COMPOSITION AND SEMICONDUCTOR APPARATUS

TECHNICAL FIELD

The present invention relates to an adhesion promoter, an addition curable organopolysiloxane resin composition and a semiconductor apparatus.

BACKGROUND ART

For an encapsulant for an LED, it has been desired a material excellent in heat resistance, light resistance, workability, adhesiveness, gas barrier property and curing characteristics, and a thermoplastic resin such as an epoxy resin, a poly(meth)acrylate, and a polycarbonate, etc., has heretofore been often used. Due to a recent trend toward higher output of LED light emitting apparatus, however, it has come to be found that use of these thermoplastic resins causes a problem of heat resistance or discoloration resistance under a condition of a high temperature over a prolonged period of time.

In addition, in recent years, when an optical device is to be soldered to a substrate, a lead-free solder has been used in many cases. This lead-free solder has higher melting temperature as compared with that of the conventional solder, and it is required to carry out soldering generally raising a temperature of 260° C. or higher. When soldering is carried out at such a temperature, in the conventional encapsulant comprising the thermoplastic resin, it has also been found that inconveniences occur, e.g., deformation occurs or the encapsulant becomes yellowing due to high temperature, etc.

As described above, encapsulants are required to have more excellent heat resistance compared to previous ones due to a trend toward higher output of LED light emitting apparatus and use of lead-free solders. Until now, a resin composition for optical purpose in which nano silica is filled in a thermoplastic resin, etc., has been proposed for the purpose of improvement in heat resistance (Patent Literatures 1 and 2), but in the thermoplastic resin, there is a limit in heat resistance, and sufficient heat resistance cannot be obtained.

A silicone resin which is a thermosetting resin is excellent in heat resistance, light resistance, and light transmissivity, so that it has been investigated to use the same as an encapsulant for an LED (Patent Literatures 3 to 5). However, the silicone resin is weaker in resin strength as compared with that of an epoxy resin, etc., and has large gas permeability (i.e., gas barrier property is low), so that there is a defect that luminance is lowered by sulfurization of an electrode, etc.

Also, for example, when a silicone resin containing a silicate-based phosphor is used for an encapsulant for an LED, water vapor is migrated into the encapsulant of the silicone resin having low gas barrier property, so that there is a problem that water is reacted at the surface of the phosphor to decompose the phosphor, whereby fluorescent characteristics are markedly lowered. Thus, when the conventional silicone resin is used for encapsulant for an LED, there are problems that long-term reliability of the LED under highly humid is lowered, in addition to the problem that luminance is lowered due to sulfurization of an electrode, etc., so that a demand to improve gas barrier property of the silicone resin has been increased.

As a measure thereof, it has been investigated to make refractive index high and to improve gas barrier property by introducing an aromatic substituent such as a phenyl group, etc. However, if the aromatic substituent is introduced, change in viscoelasticity at heating becomes large, so that there are problems that crack resistance is lowered as compared with a methylsilicone resin, or adhesiveness to the LED package is worsened.

For the improvement in adhesiveness, it has been investigated to blend an epoxy group-containing organopolysiloxane or a nitrile compound (Patent Literatures 6 and 7), but heat resistance is lowered so that an amount to be blended is limited, whereby it cannot be said that sufficient adhesiveness can be obtained. Therefore, development of an encapsulant excellent in heat resistance, having good workability, excellent in mechanical characteristics, heat resistance and adhesiveness of the cured product, and further excellent in gas barrier property has been required.

CITATION LIST

Patent Literature

PATENT LITERATURE 1: Japanese Patent Laid-Open Publication No. 2012-214554
PATENT LITERATURE 2: Japanese Patent Laid-Open Publication No. 2013-204029
PATENT LITERATURE 3: Japanese Patent Laid-Open Publication No. 2006-213789
PATENT LITERATURE 4: Japanese Patent Laid-Open Publication No. 2007-131694
PATENT LITERATURE 5: Japanese Patent Laid-Open Publication No. 2011-252175
PATENT LITERATURE 6: Japanese Patent No. 5060074
PATENT LITERATURE 7: Japanese Patent Laid-Open Publication No. 2014-218679

SUMMARY OF INVENTION

Technical Problem

The present invention was made in view of the above situation, and has an object to provide an adhesion promoter which can make a cured product of an addition curable organopolysiloxane resin composition excellent in heat resistance, workability, adhesiveness, and gas barrier property by adding it to the composition. In addition, it has an object to provide an addition curable organopolysiloxane resin composition containing such an adhesion promoter and a semiconductor apparatus encapsulated by the composition.

To accomplish the objects, in the present invention, it is provided an adhesion promoter for promoting adhesiveness of a cured product of an addition curable organopolysiloxane resin composition, the adhesion promoter comprising at least one alkoxy group bonded to a silicon atom, and at least one cyano group-containing organic group bonded to a silicon atom in one molecule.

When such an adhesion promoter is employed, by adding it to an addition curable organopolysiloxane resin composition, the cured product of the composition can be made a material excellent in heat resistance, workability, adhesiveness, and gas barrier property.

It is also preferred that the adhesion promoter is a material represented by the following average formula (1), $$R^1_a SiO_{(4-a)/2} \qquad (1)$$

wherein, $R^1$ represents a hydrogen atom, or a group selected from the group consisting of an alkyl group having 1 to 10 carbon atoms, an alkenyl group having 2 to 20 carbon atoms, an aryl group having 6 to 20 carbon atoms, an alkoxy group having 1 to 10 carbon atoms, an epoxy group-containing organic group having 3 to 10 carbon atoms, and a cyano group-containing organic group having 1 to 10 carbon atoms other than a cyano group; the material has at least one alkoxy group and at least one cyano group-containing organic group in the molecule; and "a" represents a number satisfying $1.0 \leq a < 4.0$.

As mentioned above, the adhesion promoter of the present invention may be mentioned an organopolysiloxane represented by the average formula (1).

In addition, it is preferred that the adhesion promoter is a material represented by the following formula (2),

$$R^2SiX_bR^3_{3-b} \qquad (2)$$

wherein, $R^2$ represents a cyano group-containing organic group having 1 to 10 carbon atoms which is other than the cyano group, X represents an alkoxy group having 1 to 10 carbon atoms, $R^3$ represents a hydrocarbon group having 1 to 8 carbon atoms, and "b" represents an integer of 1 to 3.

As mentioned above, the adhesion promoter of the present invention may be mentioned a silane compound represented by the formula (2).

In this case, the adhesion promoter represented by the formula (2) is preferably 2-cyanoethyltrialkoxysilane.

As mentioned above, the silane compound represented by the formula (2) suitably used is 2-cyanoethyltrialkoxysilane.

Also, the adhesion promoter may be a material having two or more alkenyl groups.

As mentioned above, the adhesion promoter of the present invention may be a material having an alkoxy group bonded to a silicon atom and a cyano group-containing organic group bonded to a silicon atom, and having two or more alkenyl groups.

Further, the present invention is to provide an addition curable organopolysiloxane resin composition, which comprises (A) an organopolysiloxane having two or more alkenyl groups bonded to the silicon atom, (B) an organohydrogen polysiloxane having two or more hydrogen atoms bonded to the silicon atom, (C) the adhesion promoter of the present invention mentioned above, and (D) a catalyst for hydrosilylation reaction.

Such an addition curable organopolysiloxane resin composition to which the adhesion promoter of the present invention has been blended can provide a cured product which is not broken in a severe heat cycle test, excellent in adhesiveness to the substrate, etc., and gives a cured product having characteristics of low gas permeability while maintaining excellent heat resistance.

Further, in the present invention, it is provided a semiconductor apparatus which is encapsulated by the addition curable organopolysiloxane resin composition of the present invention.

The addition curable organopolysiloxane resin composition of the present invention can provide excellent heat resistance, workability, adhesiveness, and gas barrier property to the cured product. Therefore, the semiconductor apparatus encapsulated by such a composition becomes a semiconductor apparatus excellent in reliability.

Advantageous Effects of Invention

As described above, according to the adhesion promoter of the present invention, by adding it to an addition curable organopolysiloxane resin composition, the cured product of the composition can be made a material excellent in heat resistance, light resistance, workability, adhesiveness, gas barrier property and curing characteristics, and after addition of the adhesion promoter, it can make the composition low viscosity and excellent in workability. Accordingly, the addition curable organopolysiloxane resin composition containing such an adhesion promoter of the present invention is particularly suitable for a raw material for lens of a light-emitting semiconductor apparatus, a protective coating agent, a molding agent, etc. In addition, the addition curable organopolysiloxane resin composition of the present invention is excellent in gas barrier property, so that even when it is used as a raw material for a wavelength conversion film by adding thereto a silicate-based phosphor or a quantum dot phosphor which are inferior in water resistance, long-term reliability under high humidity can be ensured, whereby a light-emitting semiconductor apparatus which is good in moisture resistance and long-term color rendering properties can be provided.

DESCRIPTION OF EMBODIMENTS

In the following, the present invention is explained in more detail.

As mentioned above, an adhesion promoter has been desired which can make a cured product of an addition curable organopolysiloxane resin composition excellent in heat resistance, workability, adhesiveness, and gas barrier property by adding it to the composition.

The present inventors have earnestly studied to accomplish the objects. As a result, they have found that by blending an adhesion promoter having at least one alkoxy group bonded to a silicon atom and at least one cyano group-containing organic group bonded to a silicon atom in one molecule to an addition curable organopolysiloxane resin composition, the cured product of the composition can be made a material excellent in heat resistance, light resistance, workability, adhesiveness, gas barrier property and curing characteristics, and the composition can be made low viscosity whereby it is excellent in workability, further such an organopolysiloxane resin composition can be suitably used as a encapsulant of a semiconductor device such as an LED, etc., whereby they have accomplished the present invention.

In the following, embodiments of the present invention are explained specifically, but the present invention is not limited by these. Also, in the present specification, Me means a methyl group, Et means an ethyl group, Vi means a vinyl group, and Ph means a phenyl group.

<Adhesion Promoter>

First, the adhesion promoter of the present invention is explained in detail. The adhesion promoter of the present invention is an adhesion promoter which promotes adhesiveness of the cured product of an addition curable organopolysiloxane resin composition, and has at least one an alkoxy group bonded to a silicon atom, and at least one cyano group-containing organic group bonded to a silicon atom in the molecule. If it is such an adhesion promoter, by adding it to an addition curable organopolysiloxane resin composition, it can make the cured product of the composition excellent in heat resistance, light resistance, workability, adhesiveness, gas barrier property and curing characteristics.

As mentioned above, the adhesion promoter of the present invention is a material having an alkoxy group bonded to a silicon atom and a cyano group-containing organic group bonded to a silicon atom, and it may further have two or more alkenyl groups.

The adhesion promoter of the present invention may be mentioned a silane compound or an organopolysiloxane each having at least one alkoxy group bonded to a silicon atom and at least one cyano group-containing organic group in the molecule.

The organopolysiloxane having an alkoxy group and a cyano group-containing organic group in the molecule may be mentioned an organopolysiloxane represented by the following average formula (1),

$$R^1_a SiO_{(4-a)/2} \tag{1}$$

wherein, $R^1$ represents a hydrogen atom, or a group selected from the group consisting of an alkyl group having 1 to 10 carbon atoms, an alkenyl group having 2 to 20 carbon atoms, an aryl group having 6 to 20 carbon atoms, an alkoxy group having 1 to 10 carbon atoms, an epoxy group-containing organic group having 3 to 10 carbon atoms, and a cyano group-containing organic group having 1 to 10 carbon atoms other than a cyano group; the organopolysiloxane has at least one alkoxy group and at least one cyano group-containing organic group in the molecule; and "a" represents a number satisfying $1.0 \leq a < 4.0$.

In the average formula (1), a carbon number of the alkyl group is in the range of 1 to 10, and specific examples thereof may be exemplified by a methyl group, an ethyl group, a propyl group, an isopropyl group, a butyl group, an isobutyl group, a t-butyl group, a pentyl group, a hexyl group, a cyclohexyl group, a heptyl group, an octyl group, a nonyl group, a decyl group, etc., preferably a methyl group and an ethyl group.

A carbon number of the alkenyl group is in the range of 2 to 20, preferably in the range of 2 to 10, and specific examples thereof may be exemplified by a vinyl group, an allyl group, a propenyl group, an isopropenyl group, a butenyl group, an isobutenyl group, a pentenyl group, a heptenyl group, a hexenyl group, a cyclohexenyl group, etc., preferably a vinyl group, an allyl group and a hexenyl group.

A carbon number of the aryl group is in the range of 6 to 20, and specific examples thereof may be exemplified by a phenyl group, a tolyl group, a xylyl group, a naphthyl group, etc., preferably a phenyl group.

A carbon number of the alkoxy group is in the range of 1 to 10, and specific examples thereof may be exemplified by a methoxy group, an ethoxy group, a propoxy group, a butoxy group etc., preferably a methoxy group and an ethoxy group.

A carbon number of the epoxy group-containing organic group is in the range of 3 to 10, and specific examples thereof may be exemplified by a glycidoxyalkyl group such as a 2-glycidoxyethyl group, a 3-glycidoxypropyl group, a 4-glycidoxybutyl group, etc.; an epoxycyclohexylalkyl group such as a 2-(3,4-epoxycyclohexyl)-ethyl group, a 3-(3,4-epoxycyclohexyl)-propyl group, etc.; an oxiranylalkyl group such as a 4-oxiranylbutyl group, a 8-oxiranyloctyl group, etc., preferably a glycidoxyalkyl group, particularly preferably a 3-glycidoxypropyl group.

The cyano group-containing organic group may be so bonded that the cyano group is bonded to the silicon atom in the molecule by a linear or branched hydrocarbon chain or a hydrocarbon chain through an amide bonding, an ester bonding, an ether bonding, an ureido bonding, or a urethane bonding, etc. A carbon number of the cyano group-containing organic group other than the cyano group is in the range of 1 to 10, and specific examples thereof may be exemplified by a cyanomethyl group, a 2-cyanoethyl group, a 3-cyanopropyl group, etc., preferably a 2-cyanoethyl group.

The organopolysiloxane represented by the average formula (1) has at least one, preferably 1 to 50 alkoxy groups and at least one, preferably 1 to 10 cyano group-containing organic groups. "a" represents a number satisfying $1.0 \leq a < 4.0$, preferably a number satisfying $1.0 \leq a \leq 3.5$, more preferably a number satisfying $2.0 \leq a \leq 3.0$. If the number of "a" represents 1.0 or more, crack resistance of a cured product of the addition curable organopolysiloxane resin composition containing the organopolysiloxane as the adhesion promoter is good, while if it is less than 4.0, bleed, etc., are difficultly generated.

In the adhesion promoter represented by the organopolysiloxane, a content of the alkenyl group in one molecule is not particularly limited, and generally less than 50 mole % based on the whole $R^1$, preferably less than 30 mole % based on the whole $R^1$. In addition, in the adhesion promoter, a content of the aryl group in one molecule is not particularly limited, and generally less than 50 mole % based on the whole $R^1$, preferably less than 30 mole % based on the whole $R^1$. Further, in the adhesion promoter, a content of the alkoxy group in one molecule can be made 5 mole % or more based on the whole $R^1$.

The silane compound having both of the alkoxy group and the cyano group-containing organic group in the molecule may be mentioned a silane compound represented by the following formula (2),

$$R^2 SiX_b R^3_{3-b} \tag{2}$$

wherein, $R^2$ represents a cyano group-containing organic group having 1 to 10 carbon atoms which is other than the cyano group, X represents an alkoxy group having 1 to 10 carbon atoms, $R^3$ represents a hydrocarbon group having 1 to 8 carbon atoms, and "b" represents an integer of 1 to 3.

In the formula (2), $R^2$ represents a cyano group-containing organic group, and a number of carbon atoms which is other than the cyano group in the cyano group-containing organic group is within the range of 1 to 10, and specific examples thereof may be exemplified by a cyanomethyl group, a 2-cyanoethyl group, a 3-cyanopropyl group, etc., preferably a 2-cyanoethyl group.

X represents an alkoxy group having 1 to 10 carbon atoms, preferably 1 to 5 carbon atoms, and specific examples thereof may be exemplified by a methoxy group, an ethoxy group, a propoxy group, a butoxy group, etc., preferably a methoxy group and an ethoxy group.

$R^3$ represents a hydrocarbon group having 1 to 8 carbon atoms, preferably 1 to 6 carbon atoms, and specific examples thereof may be exemplified by an alkyl group such as a methyl group, an ethyl group, a propyl group, an isopropyl group, a butyl group, an isobutyl group, a t-butyl group, a pentyl group, a hexyl group, a cyclohexyl group, a heptyl group, an octyl group, etc., an alkenyl group such as a vinyl group, an allyl group, a propenyl group, an isopropenyl group, a butenyl group, an isobutenyl group, a pentenyl group, a heptenyl group, a hexenyl group, a cyclohexenyl group, etc., and an aryl group such as a phenyl group, a tolyl group, a xylyl group, etc., and above all, preferred are a methyl group and a phenyl group.

"b" represents an integer of 1 to 3, preferably 2 to 3.

The silane compound represented by the formula (2) preferably used is a 2-cyanoethyltrialkoxysilane.

The adhesion promoter of the present invention is preferably a liquid at normal temperature. In particular, a viscosity of the adhesion promoter of the present invention measured by the method described in JIS K7117-1: 1999 is, in general, 0.1 to 10,000 mPa·s at 25° C., and preferably in the range of 0.1 to 1000 mPa·s.

A weight average molecular weight of the adhesion promoter of the present invention is preferably in the range of 150 to 10,000, particularly preferably in the range of 200 to 5,000.

As a method for preparing such an adhesion promoter of the present invention, it can be prepared by using a cyano group-containing alkoxysilane as a simple substance, or by using a cyano group-containing alkoxysilane as a essential substance and subjecting it to equilibration reaction with a silicon compound selected from an alkoxysilane having a methyl group or an oligomer thereof, an alkoxysilane having an alkenyl group or an oligomer thereof, an alkoxysilane having a phenyl group or an oligomer thereof, an alkoxysilane having an epoxy group or an oligomer thereof, and an alkoxysilane or an oligomer thereof, in the presence of an alkali metal hydroxide such as potassium hydroxide, sodium hydroxide, lithium hydroxide, etc.; an alkali metal alcoholate such as an alkali metal alcoholate of dimethylpolysiloxane or methylphenylpolysiloxane, etc.; amines such as triethylamine, etc.; ammonium hydroxide such as tetramethylammonium hydroxide, etc.

By adding a silane compound or an organopolysiloxane containing such a cyano group-containing organic group and an alkoxy group to an addition curable organopolysiloxane resin composition as the adhesion promoter, the cured product of the composition becomes a material more excellent in heat resistance, light resistance, workability, adhesiveness, gas barrier property and curing characteristics.

<Addition Curable Organopolysiloxane Resin Composition>

Next, the addition curable organopolysiloxane resin composition of the present invention is explained. The present invention is to provide an addition curable organopolysiloxane resin composition which comprises, as a composition containing the adhesion promoter, the following Components (A) to (D):

(A) an organopolysiloxane having two or more alkenyl groups bonded to the silicon atom,
(B) an organohydrogen polysiloxane having two or more hydrogen atoms bonded to the silicon atom,
(C) the adhesion promoter of the present invention mentioned above, and
(D) a catalyst for hydrosilylation reaction.

[(A) Alkenyl Group-Containing Organopolysiloxane]

Component (A) is a main agent of the composition of the present invention, and is an organopolysiloxane having two or more alkenyl groups bonded to the silicon atom. Specific examples of Component (A) may be mentioned an organopolysiloxane represented by the following average formula (3), $$R^4_c SiO_{(4-c)/2} \qquad (3)$$

wherein, $R^4$ may be mentioned an organic group, for example, a substituted or unsubstituted monovalent hydrocarbon group having 1 to 10 carbon atoms, and specific examples thereof may be exemplified by an alkyl group such as a methyl group, an ethyl group, propyl group, an isopropyl group, a butyl group, an isobutyl group, a t-butyl group, a pentyl group, a hexyl group, a cyclohexyl group, a heptyl group, an octyl group, a nonyl group, a decyl group, etc.; an alkenyl group such as a vinyl group, an allyl group, a propenyl group, an isopropenyl group, a butenyl group, an isobutenyl group, a pentenyl group, a heptenyl group, a hexenyl group, a cyclohexenyl group, etc.; an aryl group such as a phenyl group, a tolyl group, a xylyl group, a naphthyl group, etc.; an aralkyl group such as a benzyl group, a phenethyl group, etc.; a halogenated alkyl group such as a 3-chloropropyl group, a 2-bromoethyl group, a 3,3,3-trifluoropropyl group, etc. Provided that at least two of $R^4$s are alkenyl groups in one molecule, preferably a vinyl group(s), an allyl group(s), a hexenyl group(s). Here, Component (A) herein mentioned is different from Component (C).

Also, in one molecule, one or more of the whole $R^4$ is/are an aryl group(s), preferably a phenyl group(s). Further, in the formula, "c" represents a number satisfying $0.5 \leq c \leq 2.2$, preferably a number satisfying $0.6 \leq c \leq 2.0$.

The molecular structure of Component (A) is not specifically limited and may be mentioned, for example, linear, branched-chain state, three-dimensional network (resinous), etc., in particular, a linear organopolysiloxane (A1) and a three-dimensional network (resinous) organopolysiloxane (A2) are preferably used.

[(A1) Linear Organopolysiloxane]

The linear organopolysiloxane of Component (A1) has two or more alkenyl groups and one or more aryl group in the molecule, which may contain a branched structure(s) in the molecule, and represented by the following average compositional formula (4), $$(R^{a1}_3 SiO_{1/2})_p (R^{a1}_2 SiO_{2/2})_q (R^{a1} SiO_{3/2})_r \qquad (4)$$

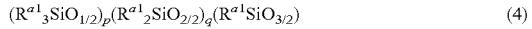

wherein, $R^{a1}$ independently represents a group selected from a hydroxyl group, an alkoxy group, a triorganosilyl group and a monovalent hydrocarbon group having 1 to 10 carbon atoms, and specific examples thereof may be exemplified by a hydroxyl group, a monovalent hydrocarbon group including a saturated aliphatic hydrocarbon group such as a methyl group, an ethyl group, a propyl group, a butyl group, and a pentyl group, etc., a saturated cyclic hydrocarbon group such as a cyclopentyl group, and a cyclohexyl group, etc., an unsaturated aliphatic hydrocarbon group such as a vinyl group, an allyl group, a 5-hexenyl group, and a 9-decenyl group, etc., an aromatic hydrocarbon group such as a phenyl group, and a tolyl group, etc., and an aralkyl group such as a benzyl group, a phenylethyl group, and a phenylpropyl group, etc., a group in which a part or whole of the hydrogen atoms bonded to the carbon atom(s) of these groups is/are substituted by a halogen atom such as fluorine, bromine, and chlorine, etc., for example, a halogenated monovalent hydrocarbon group such as a trifluoropropyl group, and a chloropropyl group, etc., a triorganosilyl group such as a trimethylsilyl group, a dimethylphenylsilyl group, and a diphenylmethylsilyl group, an alkoxy group such as a methoxy group, an ethoxy group, and a propenoxy group, etc., and an alkoxyalkyl group such as a methoxymethyl group, a methoxyethyl group, etc., and the like. Among these, a saturated hydrocarbon group having 1 to 5 carbon atoms such as a methyl group, an ethyl group, a propyl group, etc., a vinyl group and a phenyl group are preferred.

Repeating units "p," "q," and "r" in the average compositional formula are numbers satisfying $p>0$, $q>0$, $r \geq 0$ and $p+q+r=1$, preferably $0.001<p<0.67$, $0.3<q<0.999$, $0 \leq r<0.34$. Also, the linear organopolysiloxane of Component (A1) is an organopolysiloxane having two or more, preferably 2 to 3 alkenyl groups and one or more aryl group in one molecule.

Specific examples of Component (A1) may be exemplified by the following,

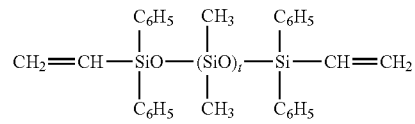

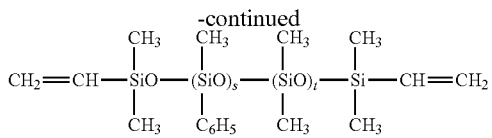

wherein, repeating units "s" and "t" represent each integers of 8 to 2,000.

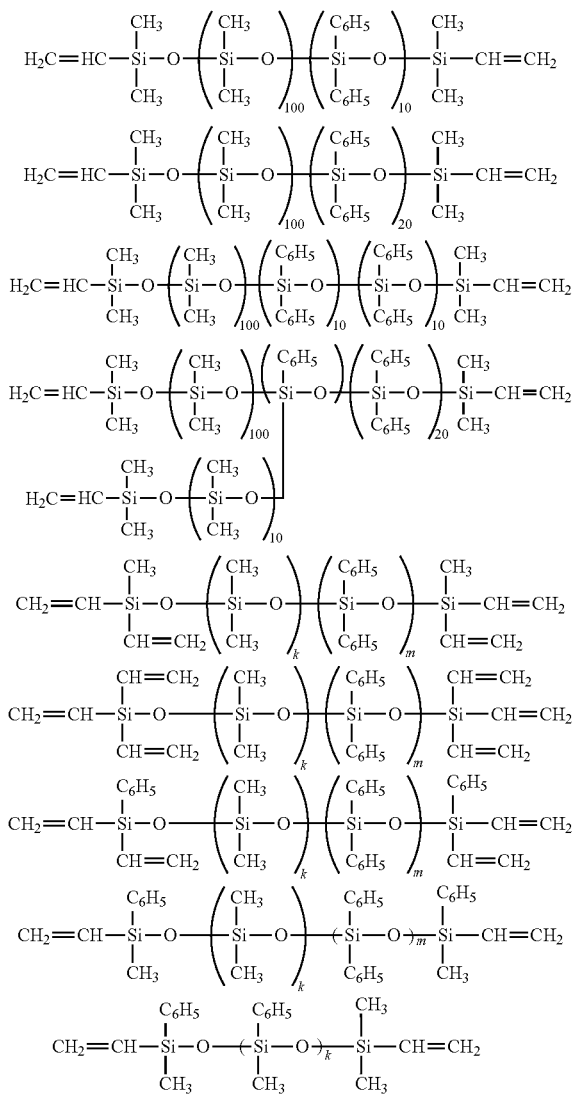

wherein, repeating units "k" and "m" represent integers of 0 or more.

The linear organopolysiloxane of Component (A1) generally has a viscosity measured by the method disclosed in JIS K7117-1: 1999 at 25° C. of 10 to 1,000,000 mPa·s, preferably 100 to 100,000 mPa·s. A ratio of the weight average molecular weight Mw/the number average molecular weight Mn is 2.0 or less, preferably the weight average molecular weight Mw/the number average molecular weight Mn is 1.8 or less.

In the present invention, the weight average molecular weight Mw and the number average molecular weight Mn designate a weight average molecular weight and a number average molecular weight measured by gel permeation chromatography (GPC) under the following conditions using polystyrenes as standard substances.

[Measurement Conditions]
Eluent: tetrahydrofuran (THF)
Flow amount: 0.6 mL/min
Detector: Differential refractive index detector (RI)
Column: TSK Guardcolumn Super H-L
TSK gel Super H4000 (6.0 mm I.D.×15 cm×1)
TSK gel Super H3000 (6.0 mm I.D.×15 cm×1)
TSK gel Super H2000 (6.0 mm I.D.×15 cm×2)
(each manufactured by Tosoh Corporation)
Column temperature: 40° C.
Sample injection amount: 20 μL (THF solution with a concentration of 0.5% by mass)

[(A2) Three-Dimensional Network (Resinous) Organopolysiloxane]

Component (A2) contains at least one of a $SiO_{4/2}$ unit and a $R^{a2}SiO_{3/2}$ unit as an essential constitutional unit, has at least two silicon atom-bonded alkenyl groups and at least one silicon atom-bonded aryl group in one molecule, and represented by the following average compositional formula (5), $$(R^{a2}{}_3SiO_{1/2})_w(R^{a2}{}_2SiO_{2/2})_x(R^{a2}SiO_{3/2})_y(SiO_{4/2})_z \quad (5)$$

wherein, $R^{a2}$s independently represent a group selected from a hydroxyl group, a triorganosilyl group, an alkoxy group having 1 to 10 carbon atoms and a monovalent hydrocarbon group having 1 to 10 carbon atoms. More specifically, it may be mentioned a hydroxyl group, a monovalent hydrocarbon group including a saturated aliphatic hydrocarbon group such as a methyl group, an ethyl group, a propyl group, a butyl group, and a pentyl group, etc., a saturated cyclic hydrocarbon group such as a cyclopentyl group, and a cyclohexyl group, etc., an unsaturated aliphatic hydrocarbon group such as a vinyl group, an allyl group, a 5-hexenyl group, a 9-decenyl group, etc., an aromatic hydrocarbon group such as a phenyl group, and a tolyl group, etc., an aralkyl group such as a benzyl group, a phenylethyl group, and a phenylpropyl group, etc., a group in which a part or whole of the hydrogen atoms bonded to the carbon atom(s) of these groups is/are substituted by a halogen atom such as fluorine, bromine, and chlorine, etc., for example, a halogenated monovalent hydrocarbon group such as a trifluoropropyl group, and a chloropropyl group, etc., a triorganosilyl group such as a trimethylsilyl group, a dimethylphenylsilyl group, and a diphenylmethylsilyl group, etc., an alkoxy group such as a methoxy group, an ethoxy group, and a propenoxy group, etc., an alkoxyalkyl group such as a methoxymethyl group, and a methoxyethyl group, etc., and the like. Among these, a saturated hydrocarbon group having 1 to 5 carbon atoms such as a methyl group, an ethyl group, and a propyl group, etc., a vinyl group, and a phenyl group are preferred.

Repeating units "w," "x," "y," and "z" in the average formula (5) represent numbers satisfying $w>0$, $x \geq 0$, $y \geq 0$, $z \geq 0$, and $w+x+y+z=1$, provided y and z are not simultaneously $y>0$ and $z>0$, and preferably $0.1<w<0.6$, $0 \leq x<0.5$, $0 \leq y<0.9$, and $0 \leq z<0.7$.

The resinous organopolysiloxane of Component (A2) is an organopolysiloxane having two or more, preferably 2 to 10 alkenyl groups and one or more, preferably two or more aryl groups in one molecule.

The resinous organopolysiloxane of Component (A2) preferably has a weight average molecular weight of 1,000 to 20,000, more preferably 1,200 to 10,000. It is also preferred that a SiOH group is contained in the range of 0.01 to 10.0 mole % based on the molar number of the total substituents bonded to the silicon atom, more preferably in the range of 0.1 to 8.0 mole %. By containing the SiOH group, adhesiveness to the substrate, etc., is improved when it is used as an LED material. In addition, when a filler or a phosphor, etc., which is an optional component is blended, wetting property is improved so that dispersibility, etc., are good. On the other hand, when a molar number of the hydroxyl group bonded to the silicon atom in Component (A2) is 10.0 mole % or less based on the molar number of the total substituents bonded to the silicon atom, defects that changes with a lapse of time become remarkable such as lowering in storage stability of the addition curable organopolysiloxane resin composition, for example, gelation or lowering in transparency after curing are difficultly generated.

In the organopolysiloxane of Component (A2), it is preferred that at least one, preferably two or more of whole $R^{a2}$ is/are an aryl group(s) in the points of high refractive index and low gas permeability.

A blended amount of Component (A2) is not particularly limited and, in general, it is 1 to 99% by mass based on the total of Component (A1) and Component (A2), preferably 50 to 95% by mass.

[(B) Organohydrogen Polysiloxane]

Component (B) is an organohydrogen polysiloxane having two or more hydrogen atoms bonded to the silicon atom in the molecule. Specific example of Component (B) may be mentioned an organohydrogen polysiloxane having two or more hydrogen atoms bonded to the silicon atom, and one or more aryl group bonded to the silicon atom in one molecule. The organohydrogen polysiloxane may be mentioned an organohydrogen polysiloxane represented by the following average compositional formula (6),

$$R^6{}_h H_i SiO_{(4-h-i)/2} \quad (6)$$

wherein, $R^6$ represents the same or different kind of any of an unsubstituted or substituted monovalent hydrocarbon group having 1 to 10 carbon atoms, a hydroxyl group, an alkoxy group or a triorganosilyl group, and "h" and "i" represent positive number preferably satisfying $0.7 \leq h \leq 2.1$, $0.001 \leq i \leq 1.0$, and $0.8 \leq h+i \leq 3.0$, more preferably $1.0 \leq h \leq 2.0$, $0.01 \leq i \leq 1.0$, and $1.5 \leq h+i \leq 2.5$.

As the $R^6$, there may be specifically mentioned a hydroxyl group, a monovalent hydrocarbon group including a saturated aliphatic hydrocarbon group such as a methyl group, an ethyl group, a propyl group, a butyl group, and a pentyl group, etc., a saturated cyclic hydrocarbon group such as a cyclopentyl group, and a cyclohexyl group, etc., an aromatic hydrocarbon group such as a phenyl group, a tolyl group, etc., an aralkyl group such as a benzyl group, a phenylethyl group, and a phenylpropyl group, etc., a group in which a part or whole of the hydrogen atoms bonded to the carbon atom(s) of these groups is/are substituted by a halogen atom such as fluorine, bromine, and chlorine, etc., for example, a halogenated monovalent hydrocarbon group such as a trifluoropropyl group, chloropropyl group, etc., a triorganosilyl group such as a trimethylsilyl group, a dimethylphenylsilyl group, and a diphenylmethylsilyl group, etc., an alkoxy group such as a methoxy group, an ethoxy group, and a propenoxy group, etc., and an alkoxyalkyl group such as a methoxymethyl group, and a methoxyethyl group, etc., and the like. Among these, a saturated hydrocarbon group having 1 to 5 carbon atoms such as a methyl group, an ethyl group, and a propyl group, etc., and a phenyl group are preferred.

The organohydrogen polysiloxane of Component (B) has at least two (in general, 2 to 200) of hydrogen atoms (SiH groups) bonded to the silicon atom, preferably 3 or more (in general, 3 to 100). Component (B) reacts with Component (A) (for example, Component (A1) and Component (A2)) to act as a crosslinking agent.

The molecular structure of Component (B) is not particularly limited and, for example, any molecular structure such as a linear, cyclic, branched, and three-dimensional network (resinous), etc., may be used as Component (B). When Component (B) has a linear structure, the SiH group may be bonded to the silicon atom at either one of the end of the molecular chain and a side chain of the molecular chain, or may be bonded to the silicon atom at both of these. In addition, an organohydrogen polysiloxane having a number of the silicon atoms in one molecule (or a polymerization degree) of, in general, 4 to 200, preferably 6 to 100 or so, and liquid or solid state at room temperature (25° C.) may be used.

Specific examples of the organohydrogen polysiloxane represented by the average compositional formula (6) may be mentioned tris(hydrogen dimethylsiloxy)phenylsilane, a both terminals trimethylsiloxy group-encapsulated methyl hydrogen siloxane.diphenylsiloxane copolymer, both terminal trimethylsiloxy group-encapsulated methyl hydrogen siloxane.diphenylsiloxane.dimethylsiloxane copolymer, a both terminals trimethylsiloxy group-encapsulated methyl hydrogen siloxanemethylphenylsiloxane.dimethylsiloxane copolymer, a both terminals dimethyl hydrogen siloxy group-encapsulated methyl hydrogen siloxane.dimethylsiloxane.diphenylsiloxane copolymer, a both terminals dimethyl hydrogen siloxy group-encapsulated methyl hydrogen siloxane.dimethylsiloxane.methylphenylsiloxane copolymer, a copolymer comprising a $(CH_3)_2HSiO_{1/2}$ unit, a $SiO_{4/2}$ unit and a $(C_6H_5)_3SiO_{1/2}$ unit, etc.

An organohydrogen polysiloxane obtained by using the unit represented by the following structure may be also used, but the invention is not limited by these.

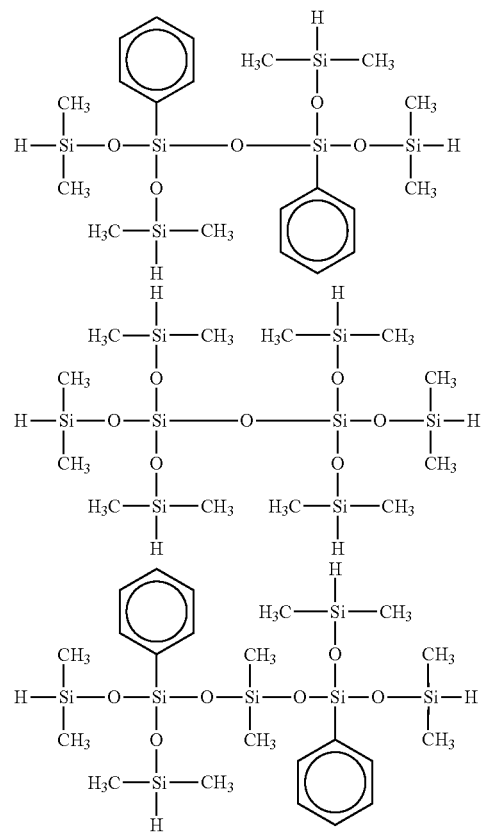

-continued

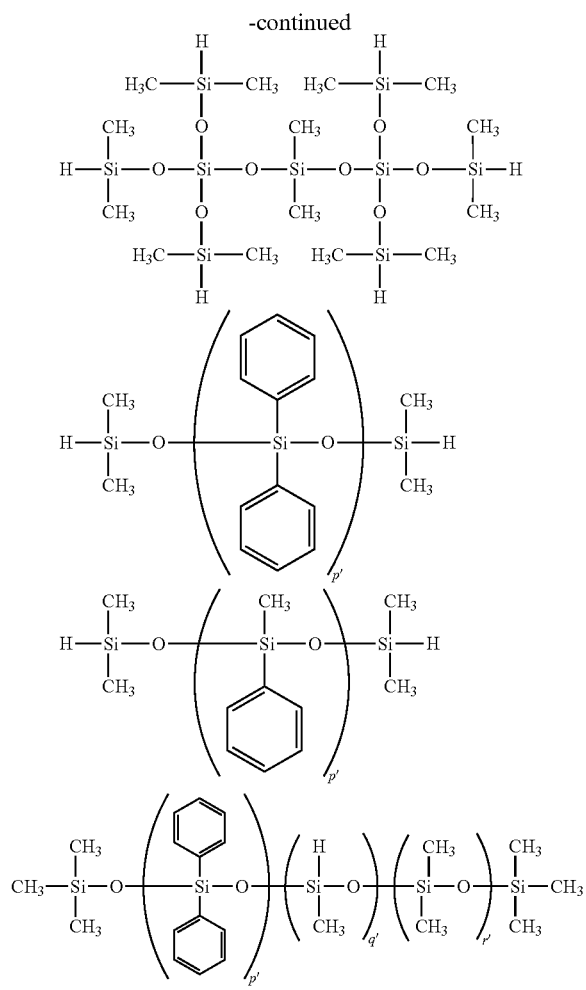

wherein repeating units "p'," "q'," and "r'" represent positive integers.

A blended amount of Component (B) is not particularly limited, and in general, it is an amount that the SiH group of Component (B) becomes 0.1 to 4.0 mole based on 1 mole of the alkenyl group contained in Component (A) (for example, Component (A1) and Component (A2)), preferably 0.5 to 3.0 mole, more preferably 0.5 to 2.0 mole, further preferably 0.8 to 2.0 mole, particularly preferably 0.7 to 1.5 mole.

If the blended amount of Component (B) is an amount that an amount of the SiH group in Component (B) becomes 0.1 mole or more, the curing reaction of the composition of the present invention sufficiently proceeds, whereby a silicone cured product can be easily obtained. In addition, the obtained cured product has sufficient crosslinking density, sufficient mechanical strength, and good heat resistance. On the other hand, if the blended amount is such an amount that the amount of the SiH group is 4.0 mole or less, unreacted SiH groups are not remained in the cured product with a large number, and occurrence of change with a lapse of time of the physical properties or lowering in heat resistance of the cured product, etc., are less likely occurred. Further, foaming due to dehydration reaction becomes difficultly occur in the cured product.

[(C) Adhesion Promoter]

(C) the adhesion promoter is to be blended to promote adhesiveness of the cured product of the addition curable organopolysiloxane resin composition of the present invention to the substrate, etc. The adhesion promoter is, as mentioned in detail above, a material having at least one alkoxy group bonded to a silicon atom, and having at least one cyano group-containing organic group bonded to a silicon atom in one molecule, and specific examples may be mentioned, as mentioned above, an organopolysiloxane represented by the following average formula (1),

wherein, $R^1$, and "a" represent the same meanings as before, and a silane compound represented by the following formula (2),

wherein, $R^2$, $R^3$, X, and "b" represent the same meanings as before.

A blended amount of the adhesion promoter of Component (C) is not particularly limited, and in general, it is 0.01 to 20 parts by mass based on the total of Components (A) and (B) as 100 parts by mass, preferably 0.1 to 10 parts by mass. If the amount is within the range, it is preferred since there is never caused that adhesiveness is insufficient, curing is failure or bleeding of the adhesion promoter itself is generate.

[(D) Catalyst for Hydrosilylation Reaction]

The catalyst for hydrosilylation reaction of Component (D) is blended to cause addition curing reaction of the composition of the present invention, and there are a platinum-based, a palladium-based, and a rhodium-based catalyst. As the catalyst, any materials which have ever been known that it can promote the hydrosilylation reaction. In view of the cost, etc., there may be exemplified by a platinum-based catalyst such as platinum, platinum black, chloroplatinic acid, etc., for example, $H_2PtCl_6 \cdot jH_2O$, $K_2PtCl_6$, $KHPtCl_6 \cdot jH_2O$, $K_2PtCl_4$, $K_2PtCl_4 \cdot jH_2O$, $PtO_2 \cdot jH_2O$, $PtCl_4 \cdot jH_2O$, $PtCl_2$, $H_2PtCl_4 \cdot jH_2O$ (here, "j" represents a positive integer), etc., or a complex thereof with a hydrocarbon such as an olefin, etc., or with an alcohol or a vinyl group-containing organopolysiloxane. These catalysts may be used a single kind alone, or in combination of two or more kinds.

A blended amount of Component (D) may be an effective amount for curing, in general, 0.1 to 500 ppm in terms of a mass as a platinum group metal based on the total amount of Component (A), Component (B) and Component (C), particularly preferably in the range of 0.5 to 100 ppm.

To the addition curable organopolysiloxane resin composition of the present invention may be optionally blended a curing inhibitor. The curing inhibitor may be used a single kind alone, or in combination of two or more kinds. The curing inhibitor may be mentioned, for example, a compound selected from the group consisting of a vinyl group-highly-containing organopolysiloxane such as tetra-methyltetravinylcyclotetrasiloxane, a triallylisocyanurate, an alkyl maleate, acetylene alcohols and a silane modified product thereof and a siloxane modified product thereof, hydroperoxide, tetramethylethylenediamine, benzotriazole and a mixture thereof.

The curing inhibitor is generally blended in an amount of 0.001 to 1.0 part by mass based on 100 parts by mass of Component (A) (for example, Component (A1) and Component (A2)) in total, preferably 0.005 to 0.5 part by mass.

[Other Blending Component]

The addition curable organopolysiloxane resin composition of the present invention is excellent in heat resistance, so that it is a suitable material for forming a resin layer coating an LED device, etc., and it becomes an LED material by blending a phosphor.

The phosphor is not particularly limited, and its blended amount can be made 0.1 to 2,000 parts by mass based on the components other than the phosphor, for example, the total component of 100 parts by mass of Components (A) to (D), more preferably 0.1 to 100 parts by mass. Also, when the addition curable organopolysiloxane resin composition of the present invention is used for the use of a phosphor-containing wavelength conversion film, a blended amount of the phosphor can be made 10 to 2,000 parts by mass. The phosphor contained in the addition curable organopolysiloxane resin composition preferably has, for example, a particle diameter measured by the particle size distribution measurement due to the laser beam diffraction method by a CILAS laser measurement apparatus, etc., of 10 nm or more, more preferably 10 nm to 10 μm, particularly preferably 10 nm to 1 μm.

The phosphor is preferably a material, for example, which can absorb light from a semiconductor device, in particular, light from a semiconductor light emitting diode which uses a nitride-based semiconductor as a light emitting layer, and can convert the wavelength to light having different wavelength. Such a phosphor may be mentioned, for example, a nitride-based phosphor activated mainly by a lanthanoid group element such as Eu, Ce, etc., an oxynitride-based phosphor; an alkaline earth metal halogen apatite phosphor activated mainly by a lanthanoid group element such as Eu, etc., or a transition metal group element such as Mn, etc., an alkaline earth metal halogen borate phosphor, an alkaline earth metal aluminate phosphor, an alkaline earth metal silicate phosphor, an alkaline earth metal sulfide phosphor, a rare earth sulfide phosphor, an alkaline earth metal thiogallate phosphor, an alkaline earth metal silicon nitride phosphor, a germanate phosphor; a rare earth aluminate phosphor activated mainly by a lanthanoid group element such as Ce, etc., a rare earth silicate phosphor; an organic phosphor or an organic complex phosphor activated mainly by a lanthanoid group element such as Eu, etc., a Ca—Al—Si—O—N-based oxynitride glass-based phosphor, etc. Incidentally, these phosphors may be used a single kind alone, or in combination of two or more kinds. As specific examples, the following phosphors may be exemplified, but the invention is not limited by these.

The nitride-based phosphor activated mainly by a lanthanoid group element such as Eu, Ce, etc., may be exemplified by $M_2Si_5N_8$:Eu, $MSi_7N_{10}$:Eu, $M_{1.8}Si_5O_{0.2}N_8$:Eu, and $M_{0.9}Si_7O_{0.1}N_{10}$:Eu (M is one kind or more selected from Sr, Ca, Ba, Mg and Zn), etc.

The oxynitride-based phosphor activated mainly by a lanthanoid group element such as Eu, Ce, etc., may be exemplified by $MSi_2O_2N_2$:Eu (M is one kind or more selected from Sr, Ca, Ba, Mg and Zn), etc.

The alkaline earth metal halogen apatite phosphor activated mainly by a lanthanoid group element such as Eu, etc., or a transition metal group element such as Mn, etc., may be exemplified by $M_5(PO_4)_3X'$:Z (M is one kind or more selected from Sr, Ca, Ba and Mg. X' is one kind or more selected from F, Cl, Br and I. Z is one kind or more selected from Eu, Mn and Eu and Mn), etc.

The alkaline earth metal halogen borate phosphor activated mainly by a lanthanoid group element such as Eu, etc., or a transition metal group element such as Mn, etc., may be exemplified by $M_2B_5O_9X'$:Z (M is one kind or more selected from Sr, Ca, Ba and Mg. X' is one kind or more selected from F, Cl, Br and I. Z is one kind or more selected from Eu, Mn and Eu and Mn), etc.

The alkaline earth metal aluminate phosphor activated mainly by a lanthanoid group element such as Eu, etc., or a transition metal group element such as Mn, etc., may be exemplified by $SrAl_2O_4$:Z, $Sr_4Al_{14}O_{25}$:Z, $CaAl_2O_4$:Z, $BaMg_2Al_{16}O_{27}$:Z, $BaMg_2Al_{16}O_{12}$:Z, and $BaMgAl_{10}O_{17}$:Z (Z is one kind or more selected from Eu, Mn and Eu and Mn), etc.

The alkaline earth metal silicate phosphor activated mainly by a lanthanoid group element such as Eu, etc., or a transition metal group element such as Mn, etc., may be exemplified by $(BaMg)Si_2O_5$:Eu, and $(BaSrCa)_2SiO_4$:Eu, etc.

The alkaline earth metal sulfide phosphor activated mainly by a lanthanoid group element such as Eu, etc., or a transition metal group element such as Mn, etc., may be exemplified by $(Ba,Sr,Ca)(Al,Ga)_2S_4$:Eu, etc.

The rare earth sulfide phosphor activated mainly by a lanthanoid group element such as Eu, etc., or a transition metal group element such as Mn, etc., may be exemplified by $La_2O_2S$:Eu, $Y_2O_2S$:Eu, and $Gd_2O_2S$:Eu, etc.

The alkaline earth metal thiogallate phosphor activated mainly by a lanthanoid group element such as Eu, etc., or a transition metal group element such as Mn, etc., may be exemplified by $MGa_2S_4$:Eu (M is one kind or more selected from Sr, Ca, Ba and Mg), etc.

The alkaline earth metal silicon nitride phosphor activated mainly by a lanthanoid group element such as Eu, etc., or a transition metal group element such as Mn, etc., may be exemplified by $(Ca,Sr,Ba)AlSiN_3$:Eu, $(Ca,Sr,Ba)_2Si_5N_8$:Eu, and $SrAlSi_4N_7$:Eu, etc.

The germanate phosphor activated mainly by a lanthanoid group element such as Eu, etc., or a transition metal group element such as Mn, etc., may be exemplified by $Zn_2GeO_4$:Mn, etc.

The rare earth aluminate phosphor activated mainly by a lanthanoid group element such as Ce, etc., may be exemplified by a YAG-based phosphor such as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(Al,Ga)_5O_{12}$, etc. In addition, $Tb_3Al_5O_{12}$:Ce, $Lu_3Al_5O_{12}$:Ce, etc., in which a part or whole of Y has been substituted by Tb, Lu, etc., may be also used.

The rare earth silicate phosphor activated mainly by a lanthanoid group element such as Ce, etc., may be exemplified by $Y_2SiO_5$:Ce, Tb, etc.

The organic phosphor or the organic complex phosphor activated mainly by a lanthanoid group element such as Eu, etc., may be exemplified by a 9,10-diarylanthracene derivative, etc.

The Ca—Al—Si—O—N-based oxynitride glass phosphor is a phosphor which comprises, in terms of mole %, 20 to 50 mole % of $CaCO_3$ in terms of CaO, 0 to 30 mole % of $Al_2O_3$, 25 to 60 mole % of SiO, 5 to 50 mole % of AlN, and 0.1 to 20 mole % of a rare earth oxide or a transition metal oxide, and an oxynitride glass in which the total of the five components is made 100 mole % is used as a matrix material. In the phosphor using the oxynitride glass as a matrix material, a nitrogen content is preferably 15% by mass or less. Also, in addition to the rare earth oxide ion, it is preferred that the other rare earth element ion(s) which becomes a sensitizer is contained with a content in the range of 0.1 to 10 mole % in terms of the rare earth oxide in the fluorescent glass as a co-activator.

As the other phosphors, ZnS:Eu, etc., can be mentioned. In the phosphors, in place of Eu or in addition to Eu, those containing one or more kinds selected from Tb, Cu, Ag, Au, Cr, Nd, Dy, Co, Ni and Ti may be used.

In addition, as a phosphor other than the phosphors, any phosphors having the same properties and effects as those mentioned above may be also used.

In addition to the phosphor, to Components (A) to (D), various kinds of functional additives such as a reinforcing filler, a heat stabilizer, a conductivity imparting agent, an adhesiveness imparting agent, a colorant, a lubricant, an antistatic agent, and a flame retardant, etc., may be blended. Examples of the reinforcing filler may be mentioned silicon dioxide, zirconium dioxide, titanium oxide, aluminum oxide, zinc oxide, etc., each having an average particle diameter of 3 nm to 100 μm, but the invention is not limited thereby.

A blended amount of these reinforcing fillers can be made 0.1 to 400 parts by mass based on the components other than the reinforcing fillers, for example, 100 parts by mass of the whole components of Components (A) to (D), more preferably 0.1 to 200 parts by mass.

The addition curable organopolysiloxane resin composition of the present invention can be prepared by the conventionally known process.

The addition curable organopolysiloxane resin composition of the present invention can make a cured product excellent in heat resistance, light resistance, workability, adhesiveness, gas barrier property and curing characteristics by blending the adhesion promoter of the present invention (for example, a silane compound or an organopolysiloxane having alkoxy group and a cyano group-containing organic group), so that it is an optimum material in an optical field, in particular, for an LED use.

Further, the present invention is to provide a semiconductor apparatus encapsulated by the addition curable organopolysiloxane resin composition of the present invention. The addition curable organopolysiloxane resin composition of the present invention can give a cured product excellent in heat resistance, light resistance, workability, adhesiveness (in particular, adhesiveness to a thermoplastic resin or silver to be used for a semiconductor apparatus), gas barrier property and curing characteristics. Thus, the semiconductor apparatus obtained by encapsulating semiconductor devices by such a composition becomes a semiconductor apparatus excellent in reliability.

EXAMPLES

In the following, the present invention will be explained specifically by Examples and Comparative examples, but the present invention is not restricted to the following Examples. Incidentally, all "part(s)" in Examples mean "part(s) by mass."

The weight average molecular weight (Mw) shown in the following Examples is a value measured by gel permeation chromatography (GPC) using polystyrenes as standard substances. Measurement conditions are shown below.
[GPC Measurement Conditions]
Eluent: Tetrahydrofuran
Flow rate: 0.6 mL/min
Column: TSK Guardcolumn Super H-L
 TSK gel Super H4000 (6.0 mm I.D.×15 cm×1)
 TSK gel Super H3000 (6.0 mm I.D.×15 cm×1)
 TSK gel Super H2000 (6.0 mm I.D.×15 cm×2) (each manufactured by Tosoh Corporation)
Column temperature: 40° C.
Sample injection amount: 20 μL (Sample concentration: 0.5 wt %-tetrahydrofuran solution)
Detector: Differential refractive index meter (RI)

The viscosity is a value at 25° C. Also, Me represents a methyl group, Vi represents a vinyl group, and Ph represents a phenyl group.

Example 1

An organopolysiloxane resin composition was prepared by blending 5 parts of an organopolysiloxane (viscosity: 4,000 mPa·s) represented by the following formula,

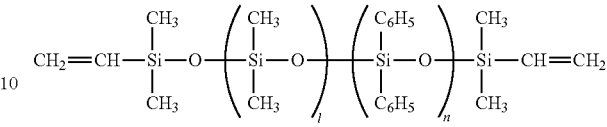

wherein, l=10, and n=8,
as Component (A1), 30 parts of a resin structure vinyl phenyl methyl polysiloxane (PVMQ) comprising 36 mole % of an $SiO_{4/2}$ unit, 36 mole % of a $Ph_2SiO_{2/2}$ unit, and 28 mole % of a $ViMe_2SiO_{1/2}$ unit (Mw=2,000, the hydroxyl group amount is 6% by mass, and the alkoxy group (MeO) amount is 0.2% by mass.) as Component (A2), an organohydrogen polysiloxane represented by the following formula,

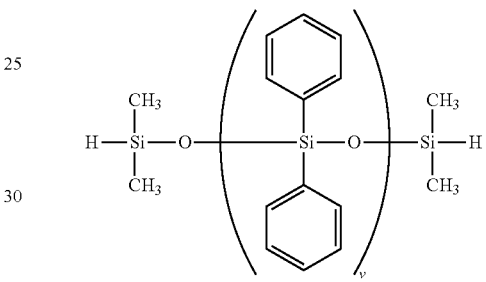

wherein, v=1,
with an amount that a ratio of the total number of the silicon atom-bonded hydrogen atoms in Component (B) based on the total number of the silicon atom-bonded vinyl groups in Components (A1) and (A2) (in the following, it sometimes shown as a SiH/SiVi ratio.) becomes 1.0, as Component (B), 1 part of 2-cyanoethyltriethoxysilane as Component (C), and 0.05 part of an octyl alcohol-modified solution of chloroplatinic acid (a content of platinum element: 2% by mass) as Component (D), and well stirred (48 mole % of the total number of the hydrogen atoms and substituents bonded to the silicon atom in the composition is a phenyl group.). This composition was molded at 150° C. for 4 hours under heating to form a cured product (120 mm×110 mm×1 mm), and measurements of the following physical properties were carried out. The results are shown in Table 1.

Example 2

In the same manner as in Example 1 except for using 30 parts of a resin structure vinyl phenyl methyl polysiloxane comprising 70 mole % of a $PhSiO_{3/2}$ unit, 2 mole % of a $ViMeSiO_{2/2}$ unit, and 28 mole % of a $ViMe_2SiO_{1/2}$ unit (Mw=1,800, the hydroxyl group amount is 5% by mass, the alkoxy (methoxy) group amount is 0.01% by mass.) in place of Component (A2) used in Example 1, a cured product was formed, and measurements of the physical properties were carried out. The results are shown in Table 1.

Example 3

In the same manner as in Example 1 except for using 30 parts of a resin structure vinyl phenyl methyl polysiloxane comprising 40 mole % of an N≡C(CH$_2$)$_2$—SiO$_{3/2}$ unit, 40 mole % of an MePhSiO$_{2/2}$ unit, and 20 mole % of a ViMe$_2$SiO$_{1/2}$ unit (Mw=2,100, the hydroxyl group amount is 6% by mass, and the alkoxy (methoxy) group amount is 0.03% by mass.) in place of Component (C) used in Example 1, a cured product was formed, and measurements of the physical properties were carried out. The results are shown in Table 1.

Example 4

In the same manner as in Example 1 except for using 30 parts of a resin structure phenylmethylpolysiloxane comprising 40 mole % of an N≡C(CH$_2$)$_2$—SiO$_{3/2}$ unit, 40 mole % of an MePhSiO$_{2/2}$ unit, and 20 mole % of an RR'SiO$_{2/2}$ unit (Mw=3,000, R=3-glycidoxypropyl group, R'=Me, the hydroxyl group amount is 3% by mass, and the alkoxy (methoxy) group amount is 0.05% by mass.) in place of Component (C) used in Example 1, a cured product was formed, and measurements of the physical properties were carried out. The results are shown in Table 1.

Comparative Example 1

In the same manner as in Example 1 except for not blending Component (C) used in Example 1, a cured product was formed, and measurements of the physical properties were carried out. The results are shown in Table 2.

Comparative Example 2

In the same manner as in Example 1 except for using 3-glycidoxypropylmethyldiethoxysilane in place of Component (C) used in Example 1, a cured product was formed, and measurements of the physical properties were carried out. The results are shown in Table 2.

Comparative Example 3

In the same manner as in Example 1 except for using 30 parts of a resin structure phenylmethylpolysiloxane comprising 40 mole % of a PhSiO$_{3/2}$ unit, 40 mole % of an MePhSiO$_{2/2}$ unit, and 20 mole % of an RR'SiO$_{2/2}$ unit (Mw=3,000, R=3-glycidoxypropyl group, R'=Me, the hydroxyl group amount is 3% by mass, and the alkoxy (methoxy) group amount is 0.05% by mass.) in place of Component (C) used in Example 1, a cured product was formed, and measurements of the physical properties were carried out. The results are shown in Table 2.

Physical properties of Examples and Comparative examples were measured by the following mentioned methods.

(1) Refractive Index

A refractive index of the cured product at 25° C. was measured by using an Abbe refractometer in accordance with JIS K0061: 2001.

(2) Tensile Test

Tensile strength and elongation at break of the cured product was measured in accordance with JIS K6249: 2003.

(3) Hardness (Type D)

Hardness of the obtained addition curable organopolysiloxane resin composition cured at 150° C. for 1 hour and hardness of the same for 4 hours were measured by using a durometer D hardness meter in accordance with JIS K6249: 2003.

(4) Surface Tackiness

Presence or absence of attachment of dust at the surface of the cured product was confirmed with naked eyes.

(5) Light Transmittance (Heat Resistance)

By using Hitachi spectrophotometer U-4100, light transmittance (450 nm) of the cured product (a thickness of 1 mm) was measured at 23° C. (initial transmittance), and this was made 100%. Then, the cured product was subjected to heat treatment at 150° C. for 1,000 hours, and then, the light transmittance was similarly measured, whereby change in the transmittance after heat treatment based on the initial transmittance was obtained.

(6) Moisture Vapor Transmission Rate

Moisture vapor transmission rate of the cured product with a thickness of 1 mm was measured by using a moisture vapor transmission meter (Lyssy, L80-5000) in accordance with JIS K7129.

(7) Adhesiveness 0.25 g of the addition curable organopolysiloxane resin composition was molded on a silver plate having 180 mm$^2$ so that the bottom area became 45 mm$^2$, cured at 150° C. for 4 hours. The cured product was broken by using a microspatula, and a ratio of the portion of cohesive failure and the peeled portion was observed when it is peeled off from the silver plate, and adhesiveness thereof was judged.
Judgement Criteria
Good: Well adhered (ratio of cohesive failure: 60% or more)
Poor: Not adhered (parts of cohesive failure: less than 60%)

(8) Thermal Shock Test

The addition curable organopolysiloxane resin composition was encapsulated in an aluminum dish (a diameter of 6 cm, a depth of 0.6 mm), and cured at 150° C. for 4 hours. The obtained cured sample was charged into a thermal cycle test from −50° C. to 150° C. (allowed to stand at −50° C. for 30 minutes and allowed to stand in a thermostat at 150° C. for 30 minutes, and this operation is made one cycle and repeated.) and presence or absence of cracks generated was confirmed.

(9) Sulfidization Resistance Test

The addition curable organopolysiloxane resin composition was encapsulated in a silver-plated plate (1 cm$^2$, a depth of 0.6 mm), and cured at 150° C. for 4 hours. The obtained cured sample was charged in a encapsulated apparatus with 3 g of sulfur powder, and allowed to stand in a thermostat at 80° C. for 12 hours and reflectance of the silver-plated plate was measured. The reflectance at the initial stage was each 90%.

TABLE 1

| Examples | 1 | 2 | 3 | 4 |
|---|---|---|---|---|
| Appearance | Colorless transparent | Colorless transparent | Colorless transparent | Colorless transparent |
| Refractive index | 1.54 | 1.53 | 1.54 | 1.54 |
| Hardness (Type D) 150° C. × 1 h | 46 | 41 | 49 | 43 |
| Hardness (Type D) 150° C. × 4 h | 50 | 45 | 53 | 48 |
| Elongation at break (%) | 80 | 70 | 83 | 85 |
| Tensile strength (MPa) | 4.5 | 5.1 | 4.3 | 3.8 |
| Light transmittance (%) after heat treatment | 98 | 98 | 98 | 99 |

TABLE 1-continued

| Examples | 1 | 2 | 3 | 4 |
|---|---|---|---|---|
| Sticking of dust by surface tackiness | None | None | None | None |
| Crack resistance | No crack | No crack | No crack | No crack |
| Adhesiveness (Ag) | Good | Good | Good | Good |
| Reflectance (%) after sulfidization test | 86 | 85 | 86 | 87 |
| Moisture vapor transmission rate (g/m² · day) | 8 | 8 | 8 | 8 |

TABLE 2

| | Comparative examples | | |
|---|---|---|---|
| | 1 | 2 | 3 |
| Appearance | Colorless transparent | Colorless transparent | Colorless transparent |
| Refractive index | 1.54 | 1.54 | 1.54 |
| Hardness (Type D) 150° C. × 1 h | 45 | 43 | 43 |
| Hardness (Type D) 150° C. × 4 h | 50 | 50 | 53 |
| Elongation at break (%) | 80 | 81 | 84 |
| Tensile strength (MPa) | 4.6 | 4.3 | 4.0 |
| Light transmittance (%, after heat treatment) | 98 | 90 | 92 |
| Sticking of dust by surface tackiness | None | None | None |
| Crack resistance | No crack | No crack | No crack |
| Adhesiveness (Ag) | poor | Good | Good |
| Reflectance (%) after sulfidization test | 65 | 71 | 73 |
| Moisture vapor transmission rate (g/m² · day) | 8 | 8 | 8 |

As shown in Table 1, the cured products of Examples 1 to 4 had sufficient hardness, refractive index, heat resistance and mechanical characteristics, and low moisture vapor transmission rate.

On the other hand, as shown in Table 2, in Comparative example 1 to which no Component (C) had been blended, adhesiveness was poor, and sulfidization resistance was worsened. The cured products of Comparative examples 2 and 3 in which the epoxy group-containing silane, or the organopolysiloxane (the silane compound or the organopolysiloxane having no cyano group-containing organic group) had been used as Component (C) were improved in adhesiveness but sulfidization resistance was poor so that these could not be said to be sufficient, and poor heat resistance was resulted.

It must be stated here that the present invention is not restricted to the embodiments shown by the embodiments. The above-mentioned embodiments are merely examples so that any embodiments composed of substantially the same technical concept as disclosed in the claims of the present invention and expressing a similar effect are included in the technical scope of the present invention.

The invention claimed is:

1. An adhesion promoter for promoting adhesiveness of a cured product of an addition curable organopolysiloxane resin composition,
   the adhesion promoter comprising at least one alkoxy group bonded to a silicon atom, and at least one cyano group-containing organic group bonded to a silicon atom in one molecule,
   wherein the adhesion promoter is a material having two or more alkenyl groups.

2. The adhesion promoter according to claim 1, wherein the adhesion promoter is a material represented by the following average formula (1), $$R^1_a SiO_{(4-a)/2} \quad (1)$$

wherein, $R^1$ represents a hydrogen atom, or a group selected from the group consisting of an alkyl group having 1 to 10 carbon atoms, an alkenyl group having 2 to 20 carbon atoms, an aryl group having 6 to 20 carbon atoms, an alkoxy group having 1 to 10 carbon atoms, an epoxy group-containing organic group having 3 to 10 carbon atoms, and a cyano group-containing organic group having 1 to 10 carbon atoms other than a cyano group; the material has at least one alkoxy group and at least one cyano group-containing organic group in the molecule; and "a" represents a number satisfying $1.0 \leq a < 4.0$.

3. An addition curable organopolysiloxane resin composition which comprises
   (A) an organopolysiloxane having two or more alkenyl groups bonded to the silicon atom,
   (B) an organohydrogen polysiloxane having two or more hydrogen atoms bonded to the silicon atom,
   (C) the adhesion promoter according to claim 2, and
   (D) a catalyst for hydrosilylation reaction.

4. The adhesion promoter according to claim 1, wherein the adhesion promoter is a material represented by the following formula (2), $$R^2 SiX_b R^3_{3-b} \quad (2)$$

wherein, $R^2$ represents a cyano group-containing organic group having 1 to 10 carbon atoms which is other than the cyano group, X represents an alkoxy group having 1 to 10 carbon atoms, $R^3$ represents a hydrocarbon group having 1 to 8 carbon atoms, and "b" represents an integer of 1 to 3.

5. An addition curable organopolysiloxane resin composition which comprises
   (A) an organopolysiloxane having two or more alkenyl groups bonded to the silicon atom,
   (B) an organohydrogen polysiloxane having two or more hydrogen atoms bonded to the silicon atom,
   (C) the adhesion promoter according to claim 4, and
   (D) a catalyst for hydrosilylation reaction.

6. An addition curable organopolysiloxane resin composition which comprises
   (A) an organopolysiloxane having two or more alkenyl groups bonded to the silicon atom,
   (B) an organohydrogen polysiloxane having two or more hydrogen atoms bonded to the silicon atom,
   (C) the adhesion promoter according to claim 1, and
   (D) a catalyst for hydrosilylation reaction.

7. A semiconductor apparatus encapsulated by the addition curable organopolysiloxane resin composition according to claim 6.

8. A semiconductor apparatus encapsulated by an addition curable organopolysiloxane resin composition which comprises
(A) an organopolysiloxane having two or more alkenyl groups bonded to the silicon atom,
(B) an organohydrogen polysiloxane having two or more hydrogen atoms bonded to the silicon atom,
(C) an adhesion promoter for promoting adhesiveness of a cured product of the addition curable organopolysiloxane resin composition, and
(D) a catalyst for hydrosilylation reaction,
wherein the adhesion promoter comprises at least one alkoxy group bonded to a silicon atom, and at least one cyano group-containing organic group bonded to a silicon atom in one molecule.

9. The semiconductor apparatus according to claim 8, wherein the adhesion promoter is a material represented by the following average formula (1), $$R^1_a SiO_{(4-a)/2} \tag{1}$$

wherein, $R^1$ represents a hydrogen atom, or a group selected from the group consisting of an alkyl group having 1 to 10 carbon atoms, an alkenyl group having 2 to 20 carbon atoms, an aryl group having 6 to 20 carbon atoms, an alkoxy group having 1 to 10 carbon atoms, an epoxy group-containing organic group having 3 to 10 carbon atoms, and a cyano group-containing organic group having 1 to 10 carbon atoms other than a cyano group; the material has at least one alkoxy group and at least one cyano group-containing organic group in the molecule; and "a" represents a number satisfying $1.0 \leq a < 4.0$.

10. The semiconductor apparatus according to claim 8, wherein the adhesion promoter is a material represented by the following formula (2), $$R^2 SiX_b R^3_{3-b} \tag{2}$$

wherein, $R^2$ represents a cyano group-containing organic group having 1 to 10 carbon atoms which is other than the cyano group, X represents an alkoxy group having 1 to 10 carbon atoms, $R^3$ represents a hydrocarbon group having 1 to 8 carbon atoms, and "b" represents an integer of 1 to 3.

11. The semiconductor apparatus according to claim 10, wherein the adhesion promoter represented by the formula (2) is 2-cyanoethyltrialkoxysilane.

* * * * *